(12) United States Patent  
Bluck et al.

(10) Patent No.: US 8,363,378 B2
(45) Date of Patent: Jan. 29, 2013

(54) METHOD FOR OPTIMIZED REMOVAL OF WAFER FROM ELECTROSTATIC CHUCK

(75) Inventors: Terry Bluck, Santa Clara, CA (US); Hizam Sahibudeen, Woodlands (SG); Dennis Grimard, Ann Arbor, MI (US)

(73) Assignee: Intevac, Inc., Santa Clara, CA (US)

( * ) Notice: Subject to any disclaimer, the term of this patent is extended or adjusted under 35 U.S.C. 154(b) by 988 days.

(21) Appl. No.: 12/372,664

(22) Filed: Feb. 17, 2009

(65) Prior Publication Data

US 2010/0208409 A1    Aug. 19, 2010

(51) Int. Cl.
*H01T 23/00* (2006.01)
(52) U.S. Cl. .................................................. 361/234
(58) Field of Classification Search .................. 361/234
See application file for complete search history.

(56) References Cited

U.S. PATENT DOCUMENTS

| | | | |
|---|---|---|---|
| 5,715,132 A | 2/1998 | Steger et al. | |
| 5,720,818 A | 2/1998 | Donde et al. | |
| 5,904,776 A | 5/1999 | Donde et al. | |
| 5,946,184 A * | 8/1999 | Kanno et al. | 361/234 |
| 6,108,189 A | 8/2000 | Weldon et al. | |
| 6,370,006 B1 | 4/2002 | Kumar et al. | |
| 6,490,145 B1 | 12/2002 | Kholodenko et al. | |
| 6,500,299 B1 | 12/2002 | Mett et al. | |
| 6,572,814 B2 | 6/2003 | Shamoulian et al. | |
| 6,581,275 B2 | 6/2003 | Narendrnath et al. | |
| 6,646,857 B2 * | 11/2003 | Anderson et al. | 361/234 |
| 7,995,323 B2 * | 8/2011 | Lu et al. | 361/234 |

* cited by examiner

*Primary Examiner* — Stephen W Jackson
(74) *Attorney, Agent, or Firm* — Nixon Peabody LLP; Joseph Bach, Esq.

(57) ABSTRACT

Systems and methods for optimally dechucking a wafer from an electrostatic chuck are described. The force on a lift-pin mechanism is monitored and a dechuck voltage is determined based on the force. The wafer is dechucked at the determined dechuck voltage.

42 Claims, 12 Drawing Sheets

METHOD FOR OPTIMIZED REMOVAL OF WAFER FROM ELECTROSTATIC CHUCK

BACKGROUND

1. Field

The subject invention relates to electrostatic chucks and, in particular, to a method for safe and optimal removal of a wafer from an electrostatic chuck.

2. Related Art

In electrostatic chucks, an adjustable voltage source applies voltage to the electrode(s) to create electrostatic forces between the wafer and the chuck surface to secure the wafer to the chuck surface. Lift pins are provided to lift the wafer off of the chuck surface when the electrostatic forces are removed. It can, however, be very difficult to determine when the electrostatic forces have been removed or are sufficiently low to safely lift the wafer off the chuck surface. If the wafer is lifted when the electrostatic forces are too high, the wafer can jump or even break, creating particles or shattering the wafer, which requires cleaning of the substrate processing tool. Both the loss of the wafer and cleaning are costly. Cleaning is also time consuming, requiring shut down of the entire substrate processing tool.

It is known that there is a particular voltage that if applied to the electrostatic chuck electrode can compensate for the electrostatic field that causes the wafer to stick to the chuck surface (i.e., a dechuck voltage). Typically, there is an optimum value for the dechucking voltage—if the applied dechucking voltage is above or below this optimum value, a significant electrostatic attractive force is still present between the wafer and the chuck surface.

Many methods have been developed to determine the proper dechuck voltage (i.e., optimum value for the dechuck voltage). Exemplary methods include self-bias approximation, residual charge measurement, look-up tables, and He gas leak rate measurement. However, all of the known methods have systemic problems. For example, the He gas leak rate method generates particles, requiring cleaning of the tool. In addition, the He gas leak rate is not a reliable predictor of a dechucked wafer and it cannot be used in a feedback loop because it is too slow and provides a signal that is too noisy. The self-bias approximations are complex models that require costly measurement devices, require a long lead time to develop properly, and are still just an estimate subject to many assumptions.

In addition, the proper dechuck voltage depends on the wafer type, process, temperature and hardware configuration. None of the existing methods take into account these wafer-to-wafer and chamber-to-chamber variations accurately or reliably.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, a method is provided for determining whether it is safe to remove a wafer from a chuck. The determination is made by monitoring the force on a lift-pin mechanism by, for example, monitoring the motor current that actuates the lift pins. It will be appreciated that the monitored current is proportional to the motor torque caused by actuation of the lift-pin mechanism; accordingly, in the specification that follows current and motor torque are used interchangeably. When the motor current reaches a predetermined safe value, the chuck voltage is held at a fixed value (i.e., the dechuck voltage). The wafer can then be safely separated from the chuck surface.

In an exemplary process, prior to processing the wafers and during a characterization period, the lift pin motor current is measured with an unclamped wafer at various pin positions. These values may be used to determine a range of motor current values which indicate that the wafer is safe to lift (e.g., the predetermined safe value). This determination of the predetermined safe value can be done once per wafer, once per day, after a wet clean, or after seasoning, etc.

A wafer process (e.g., deposition, etch, clean, etc.) is then performed while the wafer is clamped to the electrostatic chuck. When the wafer process ends, the backside gas pressure is optionally removed and an initial clamping voltage is applied. The lift pins are then raised slightly to apply a small amount of pressure to the wafer (i.e., the pressure position). The electrostatic chuck voltage starts at the initial clamp voltage and is swept through a range of voltages (e.g., −5000V to +5000V for a coulombic chuck and −1000V to +1000V for a Johnson Rahbeck (JR)-type chuck, etc.), while the motor current is monitored by a control system. The motor current is monitored to identify a minimum current value when the lift pins are at the pressure position.

In one embodiment, the voltage corresponding to the minimum motor current is applied to dechuck the wafer, the chuck surface is discharged and the lift pins are then raised to the removal position position.

In another embodiment, the wafer is dechucked using the voltage corresponding to the minimum motor current if the minimum motor current is also negative.

In yet another embodiment, the wafer is dechucked using the voltage corresponding to the minimum motor current if the minimum motor current falls within an empirical range (e.g., a safe range as identified by the predetermined safe values in the characterization process prior to wafer processing).

In a further embodiment, the voltage corresponding to the minimum motor current is applied, and the lift pins are raised to a position intermediate the pressure position and the removal position (i.e., an intermediate position). At the intermediate position, the motor current is again monitored to identify a motor current spike followed by a second minimum motor current. In one embodiment, the second minimum that follows the spike is verified to determine whether it corresponds to the predetermined safe values in the characterization process.

In a still further embodiment, the lift pins may be raised to the removal position if the minimum motor current is negative or falls within the empirical range and the motor current spikes when the lift pins are raised to the intermediate position and the second minimum that follows the spike is verified to determine whether it corresponds to the predetermined safe values in the characterization process.

If the wafer cannot be dechucked in any of the embodiments, the process may repeat itself until it is safe to dechuck the wafer (i.e., a feedback loop). If after a certain number of cycles, it is still not safe to dechuck automatically, an indication may be provided to manually dechuck the wafer. The manual dechuck process may use a manual version of the dechucking method described above.

According to one aspect of the invention, a substrate processing system is described. The substrate processing system includes an electrostatic chuck; lift pins to move a wafer relative to the electrostatic chuck; a motor coupled with the lift pins and utilizing motor current to move the lift pins to move the wafer relative to the electrostatic chuck; and a voltage source coupled with the electrostatic chuck, the voltage source to apply a voltage to the electrostatic chuck; and a controller to measure the force on the lift pins, signal the voltage source to adjust the voltage applied to the electrostatic chuck, and signal the voltage source to fix the voltage applied to the electrostatic chuck at the point the measured force on the lift pins corresponds with a dechuck force value.

The controller may be configured to measure the force on the lift pins by measuring the motor current.

The controller may be configured to determine a motor torque from the measured motor current.

The controller may be configured to adjust the voltage by applying a sweeping voltage.

The sweeping voltage may be between about −5000V and +5000V.

The controller may be configured to signal the motor to raise the lift pins to a pressure position, after processing of the wafer in a processing chamber is completed.

The electrostatic chuck may be a monopolar electrostatic chuck, a bipolar electrostatic chuck or a monopolar electrostatic chuck.

The controller may be configured to measure the force on the lift-pin mechanism using a force sensor.

According to another aspect of the invention, a method for dechucking a wafer from an electrostatic chuck is described. The method includes monitoring force on a lift-pin mechanism; determining a dechuck voltage based on the force; and dechucking the wafer at the dechuck voltage.

Monitoring the force on the lift-pin mechanism may include monitoring the motor torque, and determining the dechuck voltage based on the force may include determining the dechuck voltage based on the motor torque.

Dechucking the wafer at the dechuck voltage may include: applying a sweeping range of voltage applied to the electrostatic chuck; and fixing the voltage at the dechuck voltage when the motor torque is at a value corresponding to the dechuck voltage.

Dechucking the wafer at the dechuck voltage may include actuating the lift-pin mechanism with the motor.

Monitoring force may include measuring motor current.

The method may also include calibrating a controller coupled with the lift pin mechanism by monitoring force with an unclamped wafer.

The method may also include calibrating a controller coupled with the lift pin mechanism by monitoring force with a slightly clamped wafer.

Monitoring the motor torque may include identifying a minimum motor current.

Adjusting the voltage may include applying the voltage corresponding to the minimum motor current.

Adjusting the voltage may include applying the voltage corresponding to the minimum motor current if the minimum is within a predetermined empirical range.

Adjusting the voltage may include applying the voltage corresponding to the minimum motor current if the motor current is negative.

Adjusting the voltage may include applying the voltage corresponding to the minimum motor current, and the method may also include: actuating the lift pins to an intermediate position; monitoring the motor current to identify a spike followed by a second minimum motor current when the lifts pins are actuated; and actuating the lift pins to a removal position if the spike occurs and is followed by the second minimum.

The method may also include determining whether the first minimum and second minimum fall within a predetermined empirical range.

The method may also include determining whether the first minimum and second minimum are negative.

Dechucking the wafer may include discharging the chuck surface.

The force may be monitored using a force sensor.

According to a further aspect of the invention, a method for dechucking a wafer from an electrostatic chuck is described. The method includes monitoring a motor current of a motor coupled with lift pins; adjusting a voltage applied to the electrostatic chuck to a dechuck value based on the motor current; and actuating the lift pins to a removal position to separate the wafer from the electrostatic chuck when the voltage is adjusted.

The method may also include raising the lift pins to a pressure position before monitoring the motor current.

The method may also include sweeping the voltage applied to the electrostatic chuck through a voltage range.

The voltage range may be between about −5000V and +5000V.

The method may also include characterizing the wafer to identify a pre-determined current value.

The pre-determined value may include a range of values.

Determining the pre-determined value may include measuring the motor current with an unclamped wafer and measuring the motor current with a slightly clamped wafer.

Monitoring the motor current may include identifying a minimum motor current.

Adjusting the voltage may include applying the voltage corresponding to the minimum motor current.

Adjusting the voltage may include applying the voltage corresponding to the minimum motor current if the minimum is within a predetermined empirical range.

Adjusting the voltage may include applying the voltage corresponding to the minimum motor current if the motor current is negative.

Adjusting the voltage may include applying the voltage corresponding to the minimum motor current, and the method may also include: actuating the lift pins to an intermediate position; monitoring the motor current to identify a current spike followed by a second minimum motor current; and actuating the lift pins to the removal position if the current spike occurs and is followed by a second minimum.

The method may also include determining whether the first minimum and the second minimum fall within a predetermined empirical range.

The method may also include determining whether the first minimum and the second minimum are negative.

The method may also include discharging the chuck surface.

According to another aspect of the invention, a method is described that includes measuring force on a lift-pin mechanism for an unclamped wafer; storing the measured force for the unclamped wafer; measuring force on a lift-pin mechanism for a wafer clamped at a low voltage; and storing the measured force for the wafer clamped at a low voltage.

Measuring force on a lift-pin mechanism may include measuring a motor current. Measuring force on a lift-pin mechanism may include measuring a motor current at a plurality of lift pin positions. Measuring force on a lift-pin mechanism may include measuring a plurality of motor currents for the wafer clamped at a plurality of low voltages and storing each of the plurality of motor currents. The force may be measured using a force sensor.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
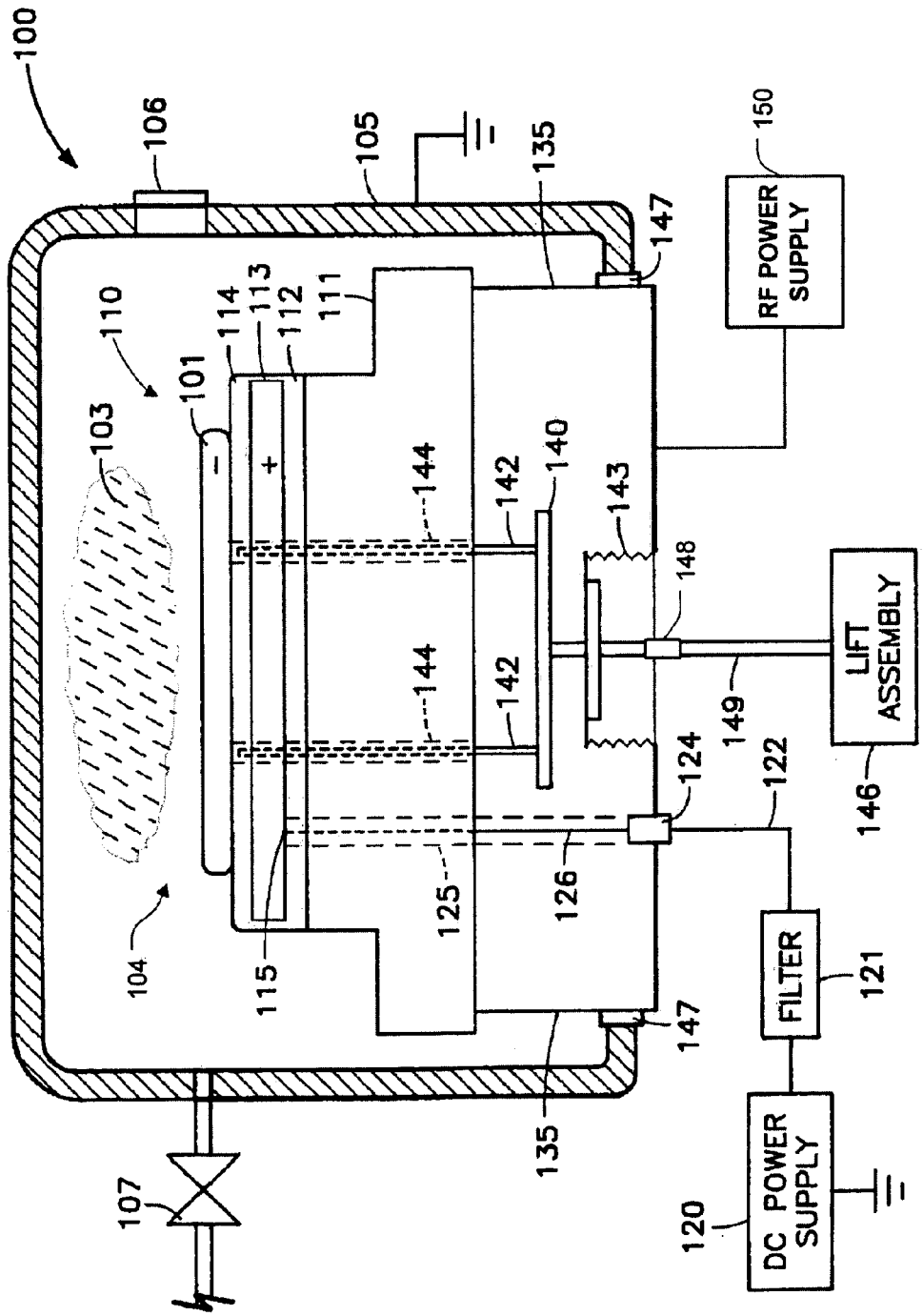
FIG. 1 is a perspective view of a substrate processing chamber in accordance with one embodiment of the invention.

An embodiment of the invention will now be described in detail with reference to FIG. 1. FIG. 1 illustrates a vacuum chamber 100 having an electrostatic chuck 110. It will be appreciated that the configuration shown in FIG. 1 is merely exemplary. The vacuum chamber 100 and electrostatic chuck 110 may have additional or fewer components, and the arrangement of the components may vary, as known to those of skill in the art.

In FIG. 1, a wafer 101 is shown secured to the chuck 110 in the vacuum chamber 100. The illustrated vacuum chamber 100 is configured for plasma processing (e.g., plasma 103 is shown in the chamber 100). Plasma processing includes, for example, etching, plasma enhanced chemical vapor deposition (PECVD), and the like. It will be appreciated that the vacuum chamber may be any type of vacuum chamber that includes an electrostatic chuck, and, therefore, other processes can be performed in the chamber. It will also be appreciated that the vacuum chamber may be a capacitively-coupled plasma (CCP) chamber (shown in FIG. 1) or, for example, an inductively-coupled plasma (ICP) source chamber (not shown). Vacuum chambers that employ sources to increase the plasma density and decouple the ion energy from ion generation are referred to, in the vernacular of those learned in the art, as high density plasmas (HDP). It will be appreciated that the vacuum chamber may an HDP chamber; exemplary HDP sources include microwave, inductive, and helicon sources.

The vacuum chamber 100 includes a vacuum-tight enclosure 105. The enclosure 105 may be made of aluminum, stainless steel or other vacuum-compatible materials. The enclosure 105 may be electrically grounded, in which case the chamber wall is an anode. A slit valve 106 is provided to allow the wafer to enter and exit the vacuum-tight enclosure 105. A valve 107 is also provided to allow gases to enter the enclosure 105.

The electrostatic chuck 110 includes a cathode pedestal 111, a lower dielectric layer 112, a chuck electrode 113 and an upper dielectric layer 114. It will be appreciated that the electrostatic chuck 110 may be a monopolar, bipolar, or multipolar chuck. The cathode pedestal 111 typically has a circular, planar top face. In one embodiment, the lower dielectric layer 112 is bonded to the top face of the pedestal 111, the chuck electrode 113 is bonded to the top face of the lower dielectric 112, and the upper dielectric layer 114 is bonded to the top face of the chuck electrode 113.

The cathode pedestal 111 is mounted on top of, and electrically connected to, a cathode base 135. In one embodiment, the cathode base 135 is hollow aluminum; it will be appreciated, however, that the cathode base 135 may be other vacuum-compatible materials. In FIG. 1, the cathode base 135 is mounted on the lower wall of enclosure 105 by an electrically insulating, annular flange 147.

The chuck electrode 113 is connected to a DC voltage supply 120. In FIG. 1, insulated wires 122 and 126 connect the chuck electrode 113 and the DC voltage supply 120. The wire 126 is attached to the chuck electrode 113 at point 115, and extends through a bore 125 in the cathode pedestal 111 and out the bottom of the cathode base 135 through a feedthrough insulator 124. The wire 122 connects the feedthrough insulator 124 to a filter 121, which may be, for example, an RF-blocking low pass filter. The filter 121 is connected to the DC voltage supply 120.

The chuck 110 also includes lift pins 142 that slide in bores 144 in the chuck 110. The lifts pins 142 are provided on a carriage 140 that is configured to raise and lower the lift pins 142 simultaneously. The carriage 140 is connected to a lift assembly 146 through a linkage 149. The lift assembly 146 includes a motor (not shown) configured to move the linkage 149 and a controller (not shown). In the illustrated embodiment, the lift pins 142 and carriage 140 are inside the cathode base 135 within the vacuum chamber 100, whereas the lift assembly 146 is outside the vacuum chamber. The linkage 149 passes through a bellows 143 which permits movement of the linkage 149 while maintaining the vacuum in the chamber 100. The linkage 149 extends out the bottom of the cathode 135 through an insulator 148. In one embodiment, the pins 142 are configured to lift the wafer 101 any value or range of values between about 0.1 mm and about 5 cm above the chuck 110. It will be appreciated that the pins 142 may lift the wafer less than 0.1 mm or more than 5 cm.

In operation, a robot arm (not shown) moves the wafer 101 into the chamber 100 through the slit valve 106. The robot places the wafer 101 on the tips of the lift pins 142, which are elevated by the lift assembly 146. The lift assembly 146 then lowers the lift pins 142 so that the wafer 101 drops onto the top face of the chuck 110. Then, either the chucking voltage is applied to the wafer and the plasma is activated, or the plasma is activated and the chucking voltage is applied. The chucking voltage is set to a value high enough to produce an electrostatic force between the wafer and the chuck adequate to prevent wafer movement during subsequent process steps. For example, the chuck voltage may be any value or range of values between about −5000V to +5000V (e.g., −5000V to +5000V for a coulombic chuck and −1000V to +1000V for a JR-type chuck, etc).

After the wafer 101 is chucked, one or more semiconductor fabrication process steps are performed in the chamber 100, such as deposition or etching films on the wafer. For processes which employ a plasma 103, an RF power supply 150 applies RF power between the cathode pedestal 111 and the grounded anode 105, which excites the plasma 103 in the region between the wafer 101 and the anode 105. In another example (not shown), the RF power supply 150 applies RF power between the chuck electrode 113 and the grounded anode 105. It will be appreciated that multiple RF power supplies may be used to excite the plasma. In one example, a first RF power supply may be operated at a first frequency, while a second RF power supply may be operated at a second frequency. The frequency range of the RF powers may be any value or range of values between about 100 kHz and 100 MHz.

The plasma 103 provides an electrically conductive path between the wafer 101 and ground. However, because of the difference between the mobilities of electrons and positive ions, a DC voltage drop appears across the plasma sheath 104 so that the wafer 101 is biased negative relative to ground. If the chucking voltage applied to the chuck electrode 113 by the DC voltage supply 120 is positive, the total voltage between the wafer 101 and the chuck electrode 113 is the sum of the wafer bias voltage and the chucking power supply voltage. Thus, the wafer bias increases the electrostatic force retaining the wafer 101.

After completion of the semiconductor fabrication process, the DC voltage supply 120 applies a voltage to highly clamp the processed wafer. The motor is then activated to raise the lift pins 142 a first distance to a pressure position. The first distance is a small distance (e.g., significantly less than 1 mm) that is sufficient to apply pressure to the wafer without removing the wafer from the chuck (i.e., the pressure position). The controller then measures the force applied to the wafer by the lift pins by, for example, measuring the motor current, while the voltage applied by the voltage source 120 is adjusted (e.g., incrementally ramped from the initial highly clamped voltage). When the motor current reaches a safe value (meaning the electrostatic forces holding the wafer against the pins have been sufficiently lowered or removed), the controller signals the voltage source 120 to hold the voltage at a fixed value which corresponds to the dechuck voltage.

When the voltage is at the dechuck voltage, the lift pins 142 are raised to a removal position. The removal position is a distance sufficient that the robot arm can slide under the wafer 101 to remove the wafer 101. For example, the removal position may be any value or range of values between about 1 cm and about 5 cm. It will be appreciated that the removal position may be less than 1 cm or greater than 5 cm. As the wafer is raised to the removal position, the source plasma remains on to discharge the chuck surface as the pins are raised to the removal position and the wafer 101 is then removed from the chamber 100.

Figure 2:
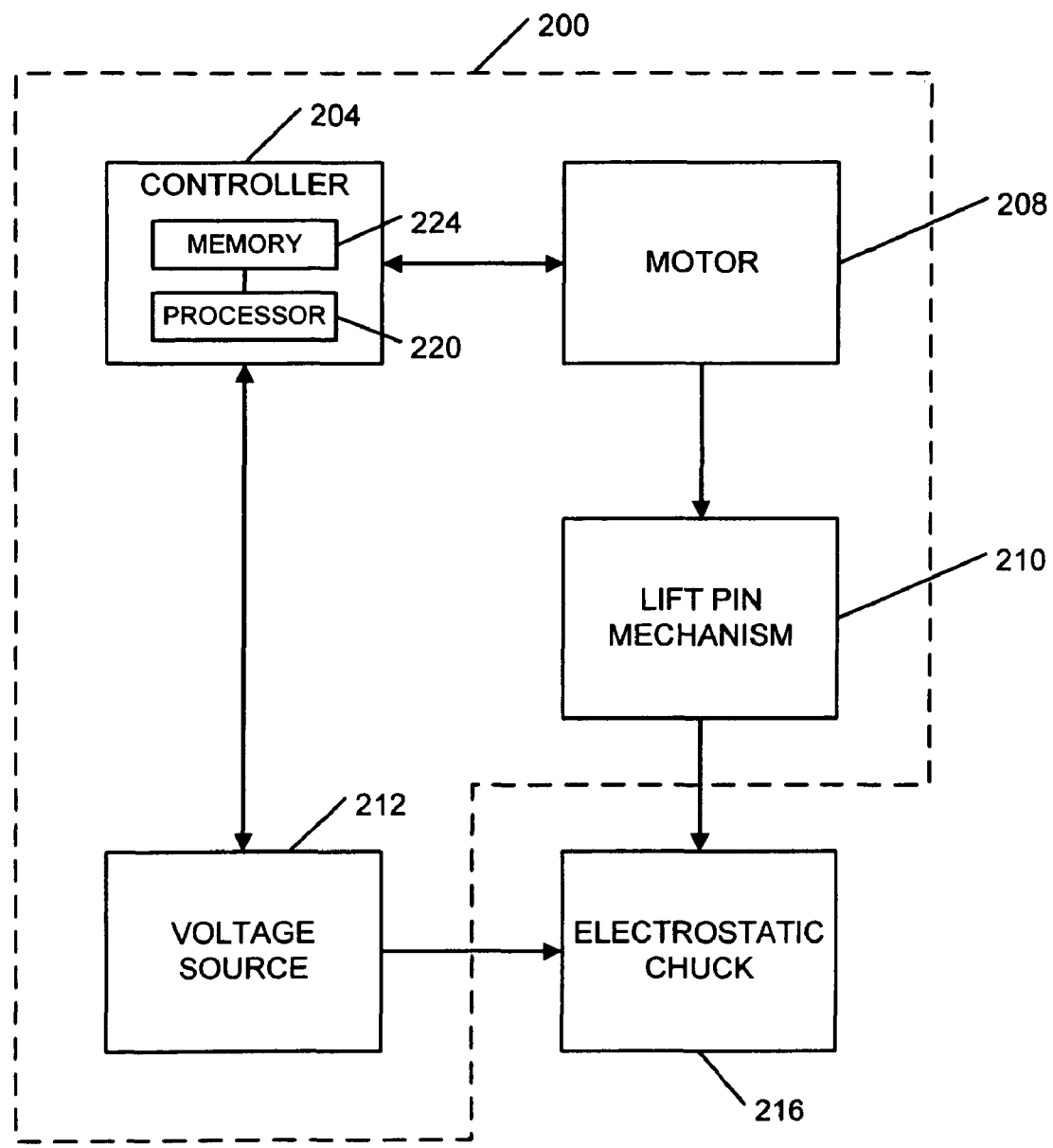
FIG. 2 is a block diagram of the dechuck system in accordance with one embodiment of the invention.

FIG. 2 is a block diagram illustrating a feedback and control system 200 according to embodiments of the invention. The feedback and control system 200 includes a controller 204, a motor 208, a lift pin mechanism 210 and a voltage source 212, which operate on an electrostatic chuck 216. The controller 204 includes at least a processor 220 and memory 224 that are connected to one another.

Referring back to FIG. 2, the controller 204 is in communication with the motor 208 and the voltage source 212. The voltage source 212 is in communication with the electrostatic chuck 216 and is configured to apply a voltage to the electrostatic chuck 216. The motor 208 is connected to the lift pin mechanism 210 which is coupled to the electrostatic chuck 216 to raise and lower the wafer relative to the electrostatic chuck 216. The controller 204 is configured to send signals to the motor 208 and the voltage source 212 to chuck and dechuck the wafer.

In one embodiment, the controller 204 is configured to determine a predetermined safe value of voltage for dechucking the wafer from the chuck (i.e., the dechuck voltage). In one embodiment, the processor 220 performs a process that determines the predetermined safe value, which is stored in the memory 224. The predetermined safe value may be a single value or a range of values. To determine the predetermined safe value, the controller 204 monitors the force required to lift the wafer relative to the chuck when no electrostatic forces are provided (i.e., an unclamped wafer). This can be done by, for example, measuring the motor current or the motor torque or using force sensors, such as strain gages, piezoelectric transducers and the like. It will be appreciated that the motor current is proportional to the motor torque; accordingly, in the specification that follows current and torque are used interchangeably. The controller 204 also monitors the motor current required to lift a wafer that is slightly clamped to the chuck (e.g., low electrostatic forces). It will be appreciated that the controller 204 may measure at one or more than one slightly clamped values (e.g., −1600V to +1600 V for coulombic chucks and −200V to +200 V for JR chucks, etc.). In another embodiment, the controller 204 monitors the motor current continuously. For example, the controller 204 may monitor the motor current continuously from the point at which it is difficult to lift the wafer from the chuck until a point at which it is easy to lift the wafer. These monitored values may be stored (e.g., in memory 224).

The controller 204 then analyzes the measured values to identify a motor current value(s) that correspond to safe removal of the wafer from the chuck. For example, the predetermined safe value may be a value that is the average of the unclamped value and the slightly clamped value, or a range between the unclamped value and the slightly clamped value or a weighted value or range of values between the unclamped value and the slightly clamped value. It will be appreciated that the predetermined safe value may also be determined using only the unclamped or the slightly clamped values (i.e., not both values). It will also be appreciated that the predetermined safe value may be determined by considering the unclamped and several slightly clamped values, or the value at which it is difficult to lift the wafer from the chuck. The controller 204 may determine a predetermined safe dechuck value for each wafer, for each batch of wafers, for each chamber, or after a wet clean, or after seasoning, etc.

In another embodiment, the controller 204 determines a safe dechuck value by determining the minimum motor current by, for example, examining a current or torque curve for the wafer. The controller 204 in addition to considering the minimum may also consider another variable, such as whether the minimum is within a predetermined empirical range or whether the minimum is also negative. The controller 204 may also or alternatively determine whether the current spikes and arrives at a second minimum when the voltage corresponding to the minimum value is applied and the lift pins are raised another small amount to the intermediate position (i.e., a position intermediate the pressure position and the removal position.

It will be appreciated that in each of the above examples, the lift pins may be raised to a dechuck position before being raised to the removal position. At the dechuck position, an operator can visually inspect the wafer to make sure the wafer is dechucked or the force (e.g., current) can be monitored to make sure the wafer can be safely dechucked. If the wafer is not safely dechucked, the process for safely dechucking the wafer, as described above, may be repeated or the wafer may be manually be dechucked. In one example, the dechuck position may be about sixty-four thousandths. It will be appreciated, however, that the dechuck position may be lower than or higher than sixty-four thousandths.

To dechuck the wafer, a significant chucking voltage may first be applied to assure that the wafer is actually chucked so as not to prematurely dechuck the wafer. Then, the controller 204 signals the motor 208 to actuate the lift pins a very small amount (i.e., an amount sufficient to apply pressure to the wafer but not actually lift the wafer off the chuck). The controller 204 then signals the voltage source 212 to sweep the voltage through a range of voltages. For example, the range of voltages may be between −5000V to +5000V (e.g., −5000V to +5000V for a coulombic chuck and −1000V to +1000V for a JR-type chuck, etc). It will be appreciated however that the range of voltages may be any value or range of values. The controller 204 measures the motor current of the motor 208 while the voltage applied by the voltage source 212 is adjusted (e.g., lowered or increased incrementally). When the voltage is adjusted to reduce the attractive force, the chucking force is reduced which reduces the pressure on the lift pins. This reduction in pressure reduces the motor torque and, therefore, the motor current required to operate the motor at that motor torque.

In one embodiment, when the motor current reaches the predetermined safe value or is within the range of predetermined safe values, the controller 204 sends a signal to the voltage source 212 to hold the voltage at a fixed value (i.e., the dechuck voltage). In another embodiment, when the motor current reaches a minimum value, the controller 204 sends a signal to the voltage source 212 to hold the voltage at the voltage corresponding to a minimum motor current value (i.e., the dechuck voltage). In this embodiment, the controller 204 may also determine whether the motor current at the minimum value is also negative, determine whether the current at the minimum is within a predetermined empirical range and/or determine whether the current spikes and is followed by a second minimum when the lift pins are raised to the intermediate position. The controller 204 also sends a signal to the motor 208 to continue actuating the lift pins to the removal position if the controller 204 determines the wafer is safely dechucked.

It will also be appreciated that although in the above description the controller 204 monitors the motor current to determine whether the wafer is safely dechucked, the controller 204 may monitor the force on the lift pins in other ways. For example, the controller 204 may be coupled to force sensors, such as strain gages, piezoelectric transducers, and the like, to determine whether the wafer is safely dechucked using the same methods described above.

Figure 3:
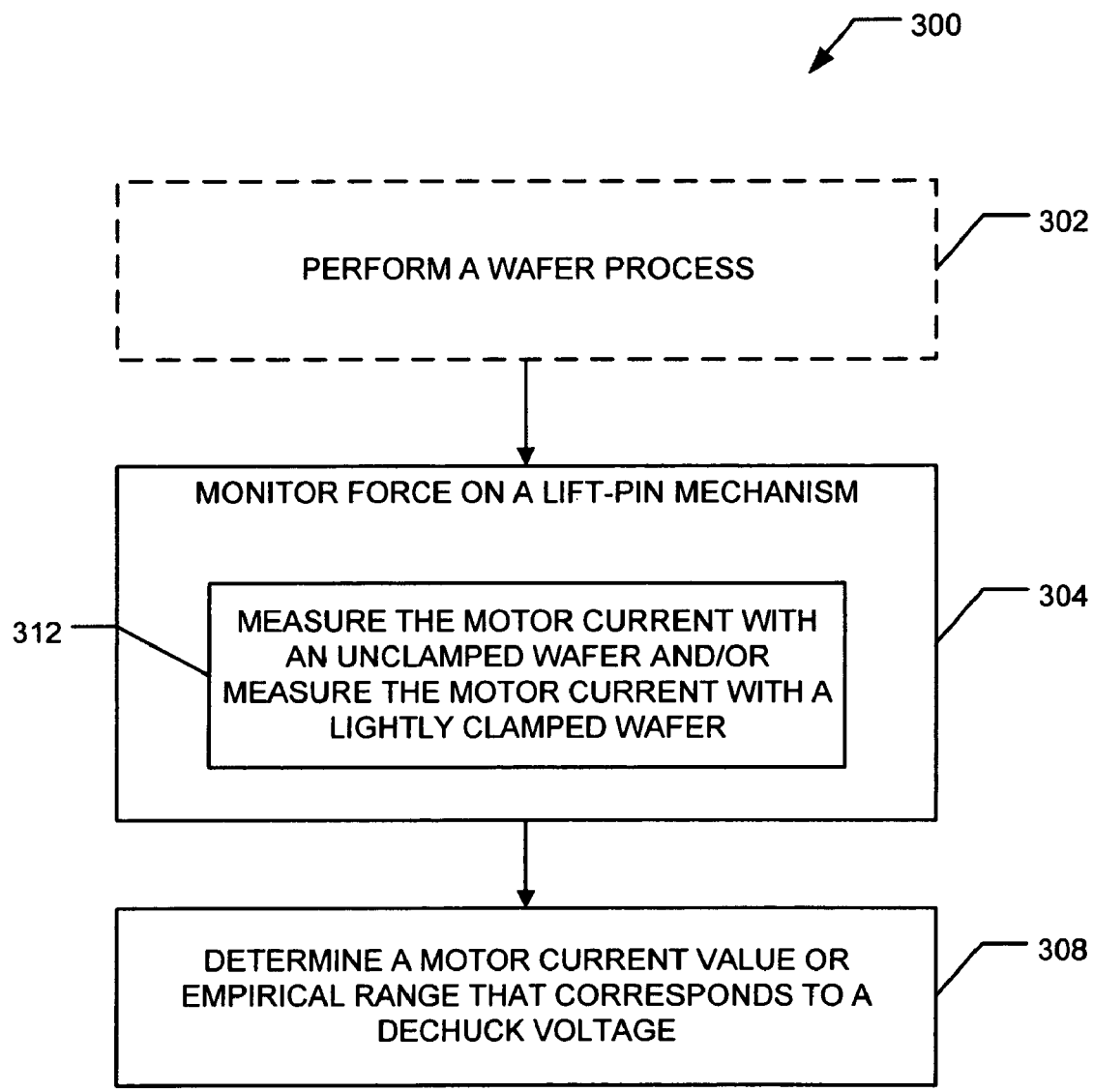
FIG. 3 is a flow diagram of a process for characterizing a wafer in accordance with one embodiment of the invention.

FIG. 3 illustrates a process 300 for characterizing a wafer. It will be appreciated that the process 300 described below is merely exemplary and may include fewer steps or a greater number of steps, and that the order of at least some of the steps may vary from that described below.

The process 300 may optionally begin by performing a wafer process (block 302). The process 300 continues by monitoring motor current on a lift-pin mechanism (block 304) and determining a motor current that corresponds with a dechuck voltage (block 308).

Figure 3A:
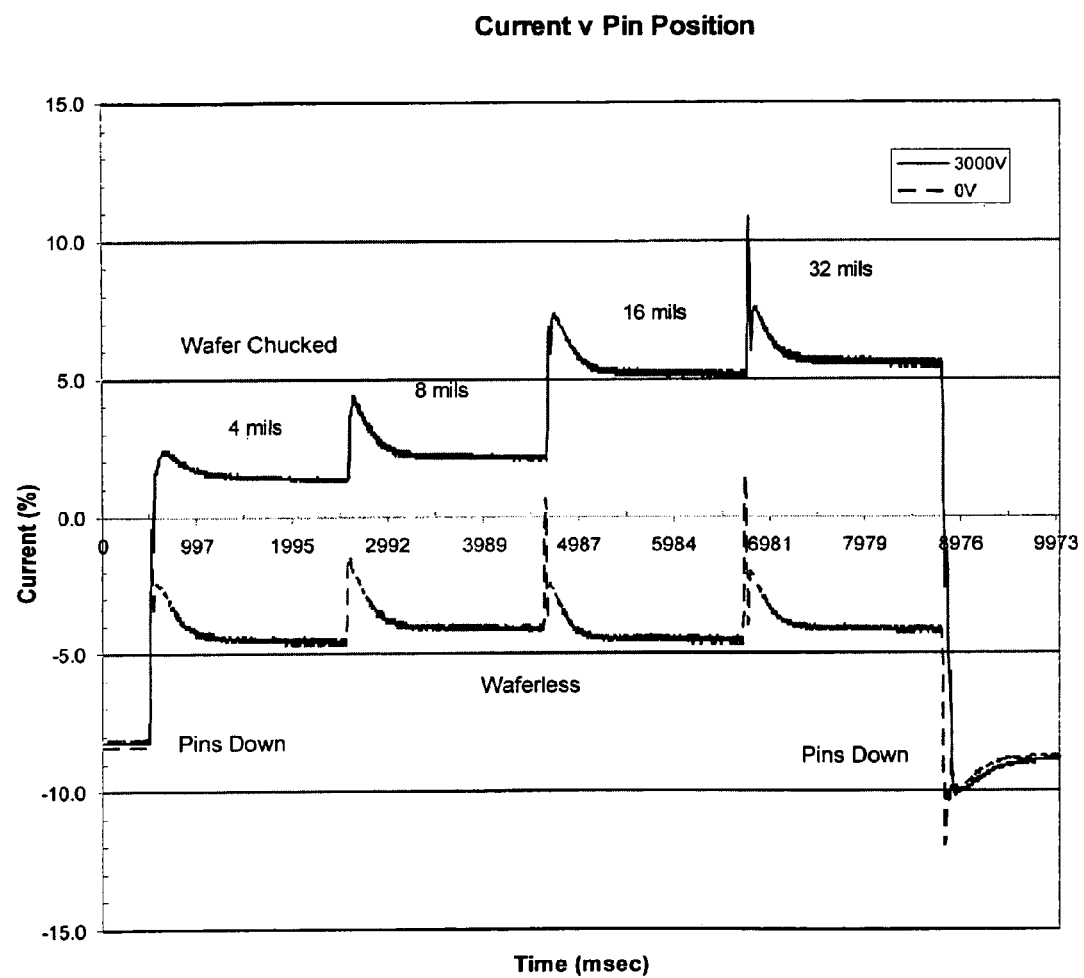
FIG. 3A illustrates a schematic view of an exemplary motor current/pin position relationship in accordance with one embodiment of the invention.

Monitoring the motor current on the lift-pin mechanism 304 may include measuring the motor current with an unclamped wafer and measuring the motor current with a lightly clamped wafer at various pin positions (block 312). It will be appreciated that the motor current that corresponds with a dechuck voltage may include determining one value or a range of motor current values that corresponds with the dechuck voltage (i.e., predetermined value(s)). It will be appreciated that the motor current may be measured at several slightly clamped values. The slightly clamped values may be any value or range of values between about −1600V and about +1600V for a coulombic chuck and between about −200V and about +200V for a JR-type chuck. It will be appreciated that the slightly clamped value may be greater than +1600V or less than −1600V. In one example, the motor current may be measured at −1600V, −800V, −400V, −200V, −100V, 0V, +100V, +200V, +400V, +800V and +1600V. FIG. 3A illustrates an exemplary current vs. pin position curve for an unclamped wafer and a wafer chucked at 3000V at a variety of pin positions (e.g., pins down, 4 mils, 8 mils, 16 mils, 32 mils and then pins down again).

Based on these values, the motor current that corresponds with the dechuck voltage may be determined. For example, the dechuck motor current may be within the range of motor currents corresponding to the −1600V to +1600V range for a coulombic chuck. In another example, the dechuck voltage may correspond to a motor current that is within a range of motor currents or a specific motor current value within the predetermined range of safe motor current values.

In another embodiment, the motor current is monitored continuously from a point at which it is difficult to lift the wafer from the chuck until a point at which it is easy to lift the wafer from the chuck. The dechuck voltage is selected to be less than the corresponding motor current value when it is difficult to lift the wafer from the chuck.

For example, with reference to FIGS. 1 and 2, the controller 204 can monitor the current of the motor 208 while the wafer 101 is unclamped and slightly clamped. Based on these values, the controller 204 identifies a motor current that corresponds to the safe removal of the wafer 101. The dechuck voltage can then be used to safely dechuck the wafer 101 from the electrostatic chuck 110.

It will be appreciated that the process 300 may be performed for each wafer, each batch of wafers, etc. to accommodate for wafer-to-wafer variations. It will also be appreciated that the process 300 may be performed for each chamber to accommodate for chamber-to-chamber variations. The process 300 may alternatively be performed after a wet clean of a chamber, after seasoning of a chamber, etc., or otherwise, as needed.

The process 300 may also include storing the measured values or range of measured values or determined values. For example, the determined value or range of values may be stored in memory 224, and the determination may be made by the processor 220.

Figure 4:
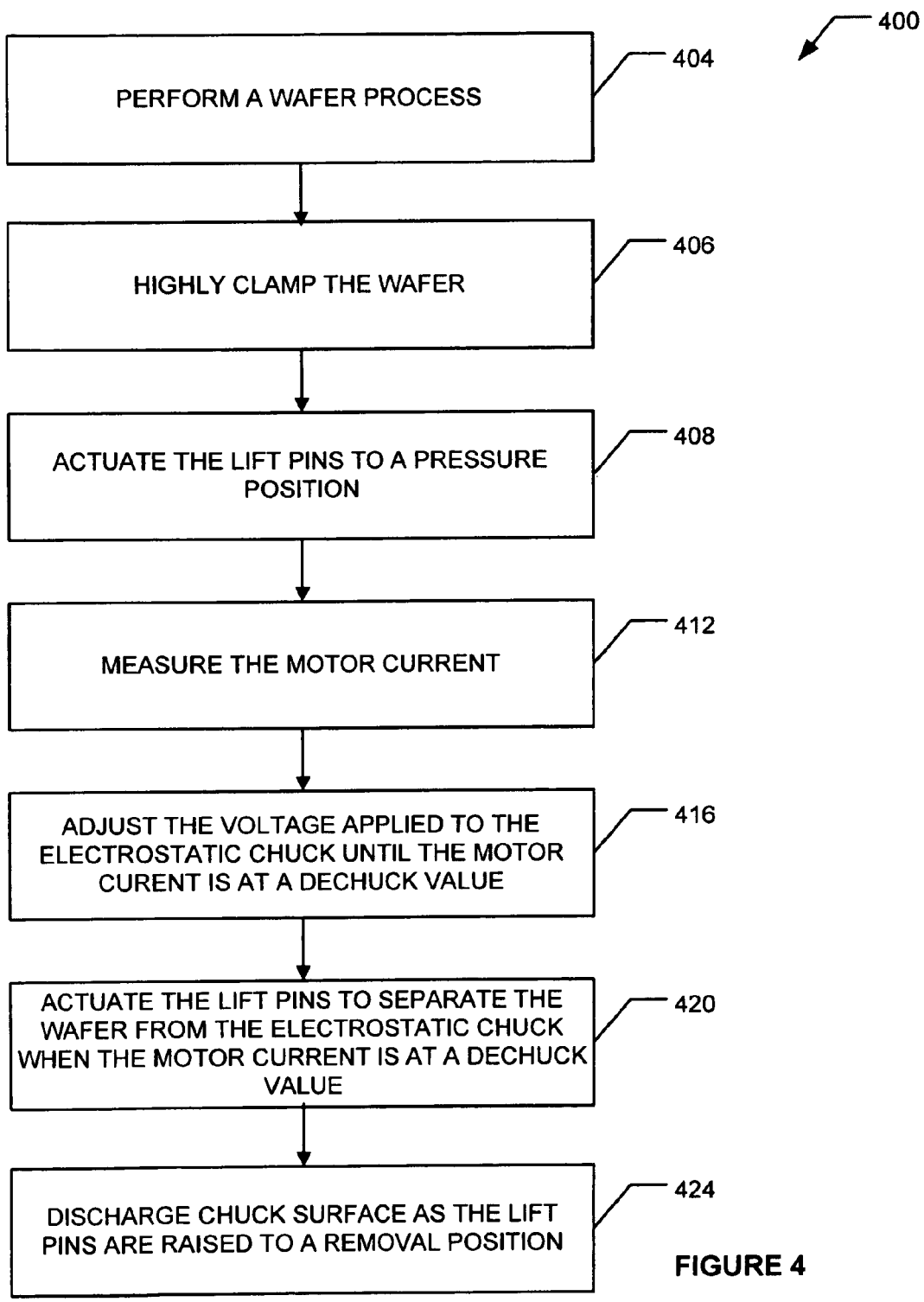
FIG. 4 is a flow diagram of a process for dechucking a wafer from an electrostatic chuck in accordance with one embodiment of the invention.

FIG. 4 illustrates a detailed process 400 for safe removal of a wafer from an electrostatic chuck. It will be appreciated that the process 400 described below is merely exemplary and may include fewer steps or a greater number of steps, and that the order of at least some of the steps may vary from that described below.

The process 400 continues by performing a wafer process (block 404). For example, a deposition process, etch process, etc. may be performed in the processing chamber 100. In one embodiment, the process 400 may optionally continue by removing backside gas pressure when the wafer process is completed.

The process 400 continues by highly clamping the wafer to the chuck (block 406). For example, the wafer may be highly clamped to the chuck by applying a voltage between about −5000V and +5000V depending on the type of chuck. The wafer is highly clamped to ensure that the wafer is actually chucked before the removal process begins.

The process 400 continues by raising the lift pins to a pressure position (block 408). For example, the pins can be raised a first, small distance that is sufficient to apply pressure to the wafer 101 (e.g., significantly less than 1 mm). The pressure position is low enough that the wafer cannot be removed from the chuck or damaged when the pins are raised the first, small distance.

The process 400 continues by measuring the motor current (block 412). For example, the controller 204 can measure the current of the motor 208.

The process 400 continues by adjusting the voltage applied to the electrostatic chuck until the motor current is at a corresponding dechuck value (block 416). The motor current is measured while the voltage is adjusted. For example, the controller 204 can signal the voltage source 212 to sweep the voltage over a range of voltages until the motor current reaches the predetermined value, and then hold the voltage when the motor current reaches the predetermined value. When the measured motor current measured matches the predetermined motor current value(s) (e.g., as determined by the process of FIG. 3), the voltage is fixed. That is, the voltage source stops adjusting the voltage and holds the voltage at the value at which the measured current matches the predetermined motor current values. This voltage corresponds to the dechuck voltage.

The process 400 continues by actuating the lift pins to separate the wafer from the electrostatic chuck (to the removal position) when the motor current is at the predetermined value (block 420) and, further, discharges the chuck surface as the pins are raised to the removal position (block 424). For example, the motor 208 can raise the lift pins 144 to a position so that the wafer 101 can be safely removed from the chuck 110 (i.e., the removal position). The chuck surface may be discharged while the lift pins are being actuated by maintaining or activating the source plasma during the pin lift. It will be appreciated that the source gas for the discharge plasma may be different than the source gas for the processing the wafer.

Figure 5:
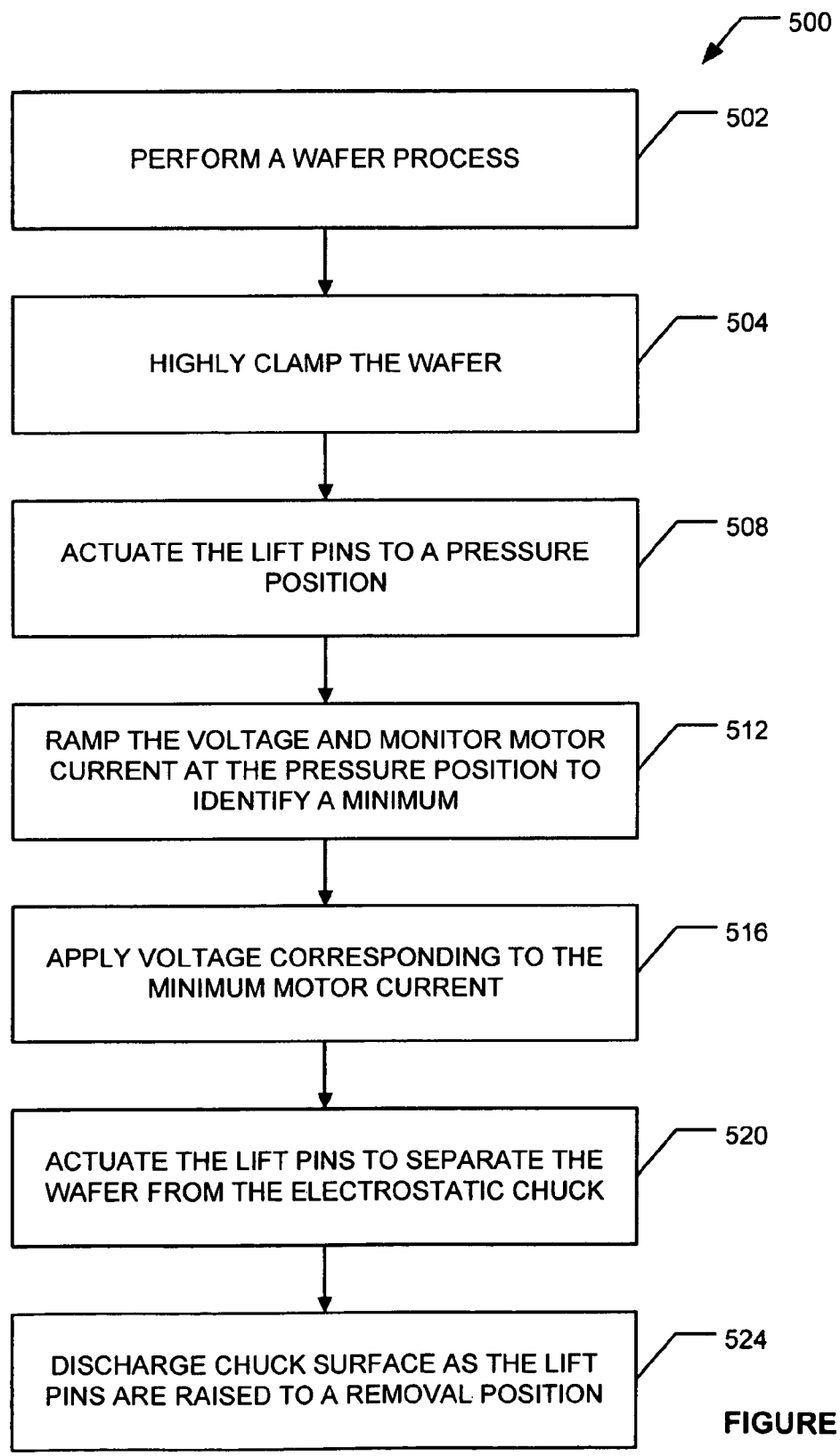
FIG. 5 is a flow diagram of a process for dechucking a wafer from an electrostatic chuck in accordance with one embodiment of the invention.

FIG. 5 illustrates a detailed process 500 for safe removal of a wafer from an electrostatic chuck. It will be appreciated that the process 500 described below is merely exemplary and may include fewer steps or a greater number of steps, and that the order of at least some of the steps may vary from that described below.

The process 500 begins by performing a wafer process (block 502), highly clamping the wafer (block 504) and actuating the lift pins to the pressure position (block 508).

The process 500 continues by ramping the voltage and monitoring the motor current at the pressure position to identify a minimum (block 512). For example, the voltage may be ramped from +5000V to −5000V. It will be appreciated that the voltage ramp may be greater than or less than +5000V to −5000V or may be a smaller range, as discussed above, depending on the type of chuck.

Figure 5A:
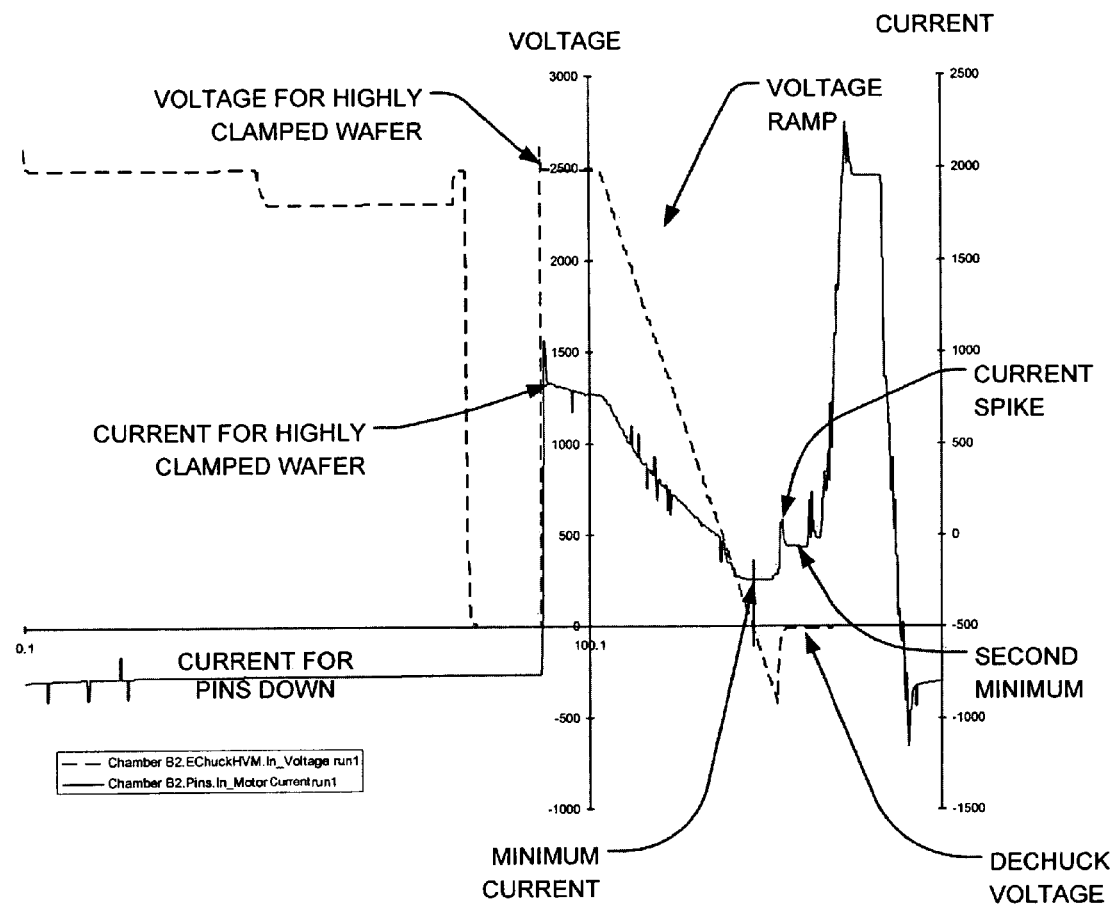
FIGS. 5A-5B illustrate schematic views of exemplary current/voltage curves in accordance with one embodiment of the invention.
Figure 5B:
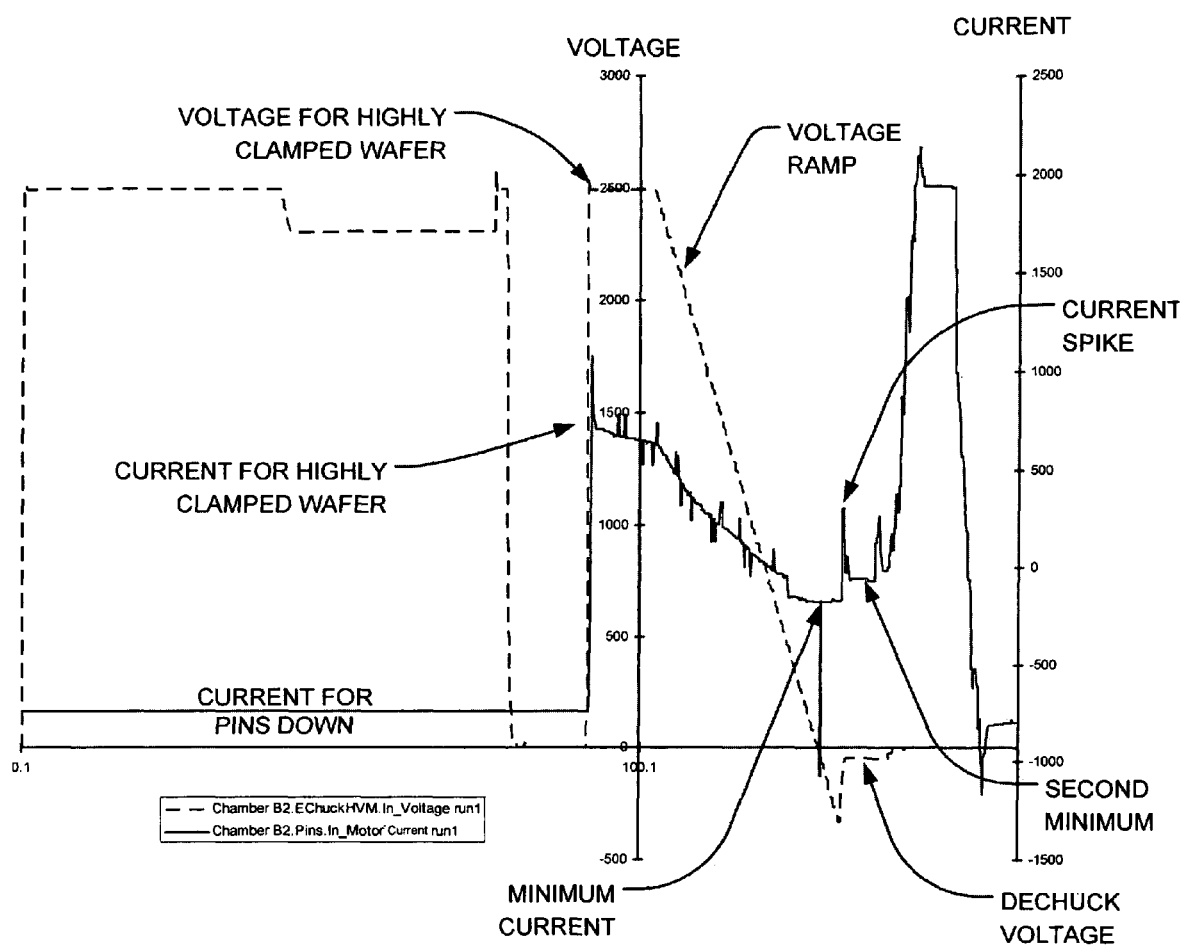

FIGS. 5A-5B illustrate exemplary motor current vs. voltage curves that can be examined to identify the minimum. As shown in FIGS. 5A and 5B, for wafers that both are chucked at 2500V, the minimum occurs at different voltages (i.e., the dechuck voltage is different for two wafers chucked at the same value). In FIG. 5A, the minimum occurred at about 0V; in FIG. 5B, on the other hand, the minimum occurred at about −75V.

The process 500 continues by applying the voltage corresponding to the minimum motor current (block 516), actuating the lift pins to separate the wafer from the electrostatic chuck (to the removal position) (block 520), and discharging the chuck surface as the pins are raised to the removal position (block 524).

In FIG. 5, the voltage at the minimum motor current (i.e., the minimum) is the dechuck voltage; however, the minimum does not always correspond with the dechuck voltage. Accordingly, the safe removal process may include verifying that the minimum corresponds with the predetermined dechuck voltage. For example, the minimum can be analyzed to determine whether the minimum falls within a predetermined empirical range (see FIG. 6), is a negative value (see FIG. 7), causes a current spike followed by a second minimum at an intermediate position (see FIG. 8), and the like, and combinations thereof (see FIG. 9).

Figure 6:
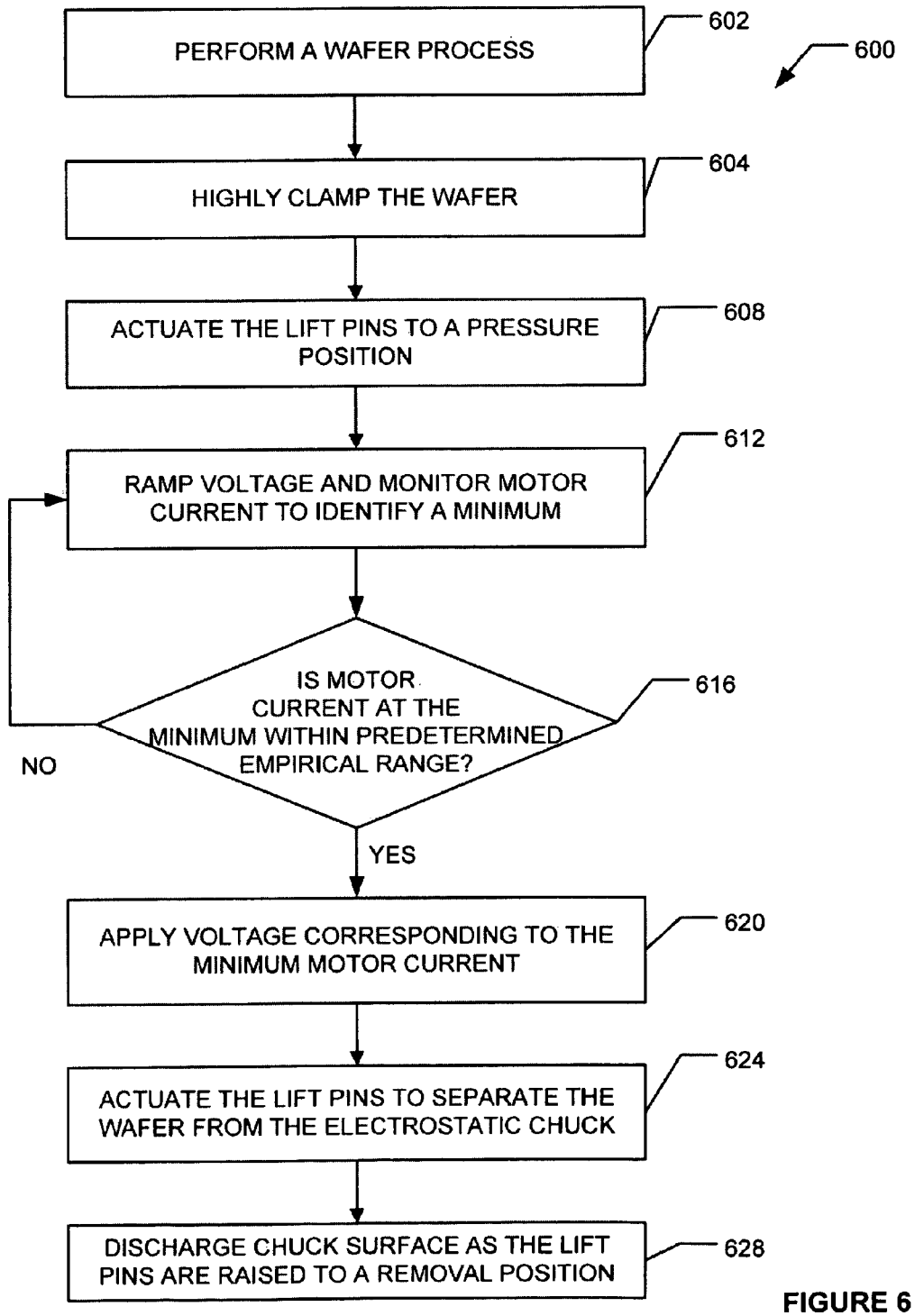
FIG. 6 is a flow diagram of a process for dechucking a wafer from an electrostatic chuck in accordance with one embodiment of the invention.

FIG. 6 illustrates a detailed process 600 for safe removal of a wafer from an electrostatic chuck. It will be appreciated that the process 600 described below is merely exemplary and may include fewer steps or a greater number of steps, and that the order of at least some of the steps may vary from that described below.

The process 600 begins by performing a wafer process (block 602), highly clamping the wafer (block 604), actuating the lift pins to the pressure position (block 608) and ramping the voltage and monitoring the motor current at the pressure position to identify a motor current minimum (block 612), as described above with reference to FIG. 5.

As shown in FIG. 6, the process 600 continues by determining whether the voltage at the minimum is within a predetermined empirical range (block 616). In one embodiment, the predetermined empirical range is determined as described above with reference to FIG. 3. If the minimum does not fall within the empirical range, the process 600 returns to block 612 and continues to cycle until the safe dechuck voltage is found. If the minimum does fall within the empirical range, the process 600 continues by applying the dechuck voltage at the motor current minimum (block 620) actuating the lift pins to separate the wafer from the electrostatic chuck (to the removal position) (block 624), and discharging the chuck surface as the pins are raised to the removal position (block 628).

It will be appreciated that there may be situations in which the process 600 can continue to cycle indefinitely if the minimum does not fall within the empirical range. In such embodiments, the controller 204 may provide an indication to a user that the wafer needs to be manually dechucked.

Figure 7:
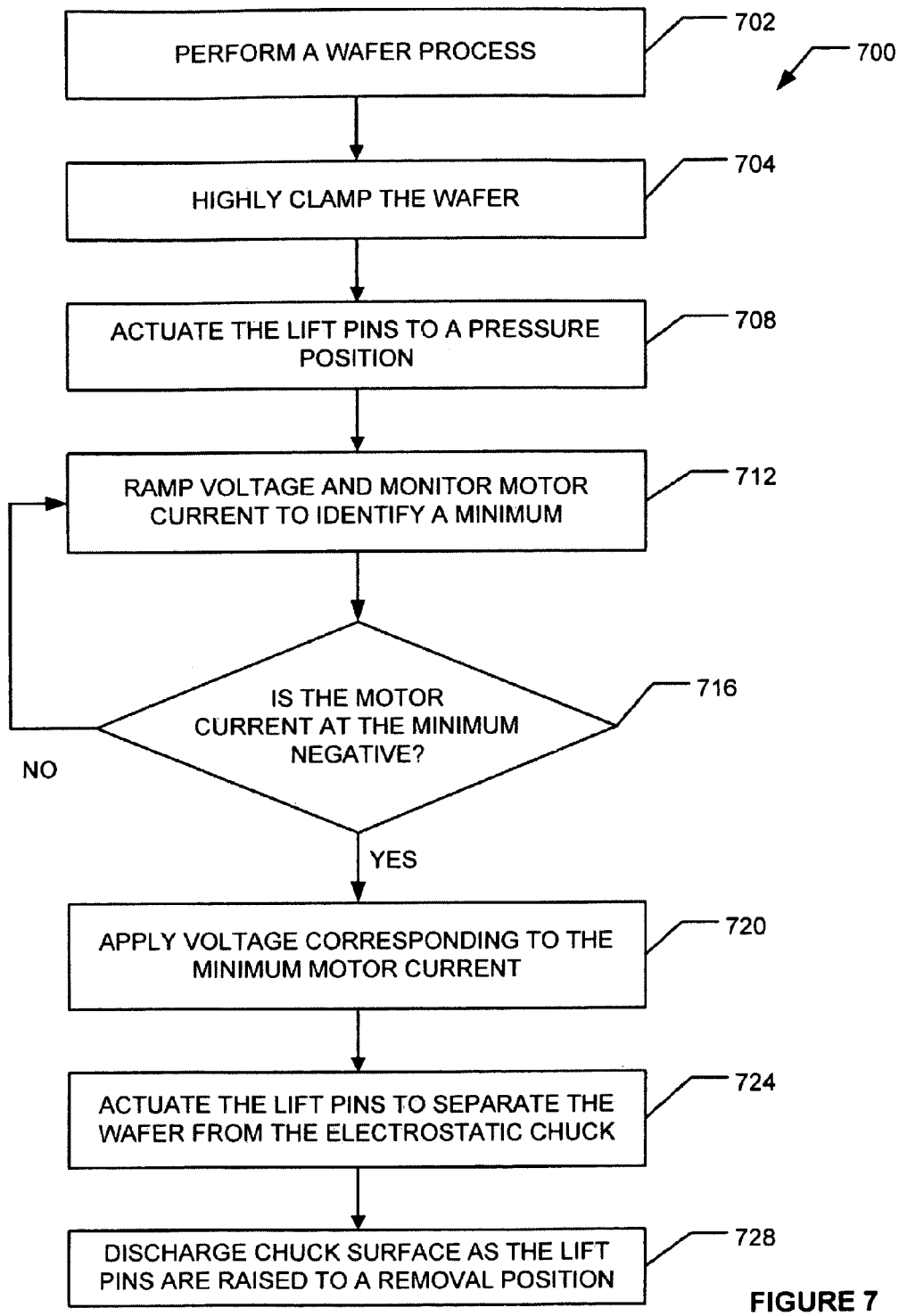
FIG. 7 is a flow diagram of a process for dechucking a wafer from an electrostatic chuck in accordance with one embodiment of the invention.

FIG. 7 illustrates a detailed process 700 for safe removal of a wafer from an electrostatic chuck. It will be appreciated that the process 700 described below is merely exemplary and may include fewer steps or a greater number of steps, and that the order of at least some of the steps may vary from that described below.

The process 700 begins by performing a wafer process (block 702), highly clamping the wafer (block 704), actuating the lift pins to the pressure position (block 708) and ramping the voltage and monitoring the motor current at the pressure position to identify a motor current minimum (block 712), as described above with reference to FIG. 5.

The process 700 continues by determining whether the motor current at the minimum is negative (block 716). It will be appreciated that in vacuum chambers that have a bellows arrangement for the lift pin mechanism, the vacuum force on the bellows arrangement may result in an opposing force applied to the motor. (That is, the vacuum force or the spring force of the bellows wants to pull the pins into a raised position and the motor must provide torque to oppose these forces to maintain the pins in a lowered position.) Therefore, depending on the particular arrangement, it may be that when lowering the pins the motor is actually under torque to oppose the upward force of the bellows. In these embodiments, if the current at the minimum is negative, the negative current indicates that the bellows pull on the lift pin mechanism and there are no electrostatic forces on the chuck to oppose the bellows. The wafer is, therefore, dechucked at the minimum if the current is negative. If the current is not negative, the process 700 returns to block 712 and continues to cycle until the wafer is dechucked. If the current is negative, the process 700 continues by applying the voltage at the minimum (block 720), actuating the lift pins to separate the wafer from the electrostatic chuck (to the removal position) (block 724) and discharging the chuck surface as the pins are raised to the removal position (block 728).

It will be appreciated that there may be situations in which the process 700 can continue to cycle indefinitely if the minimum does not correspond to a negative minimum. In such embodiments, the controller 204 may provide an indication to a user that the wafer needs to be manually dechucked.

Figure 8:
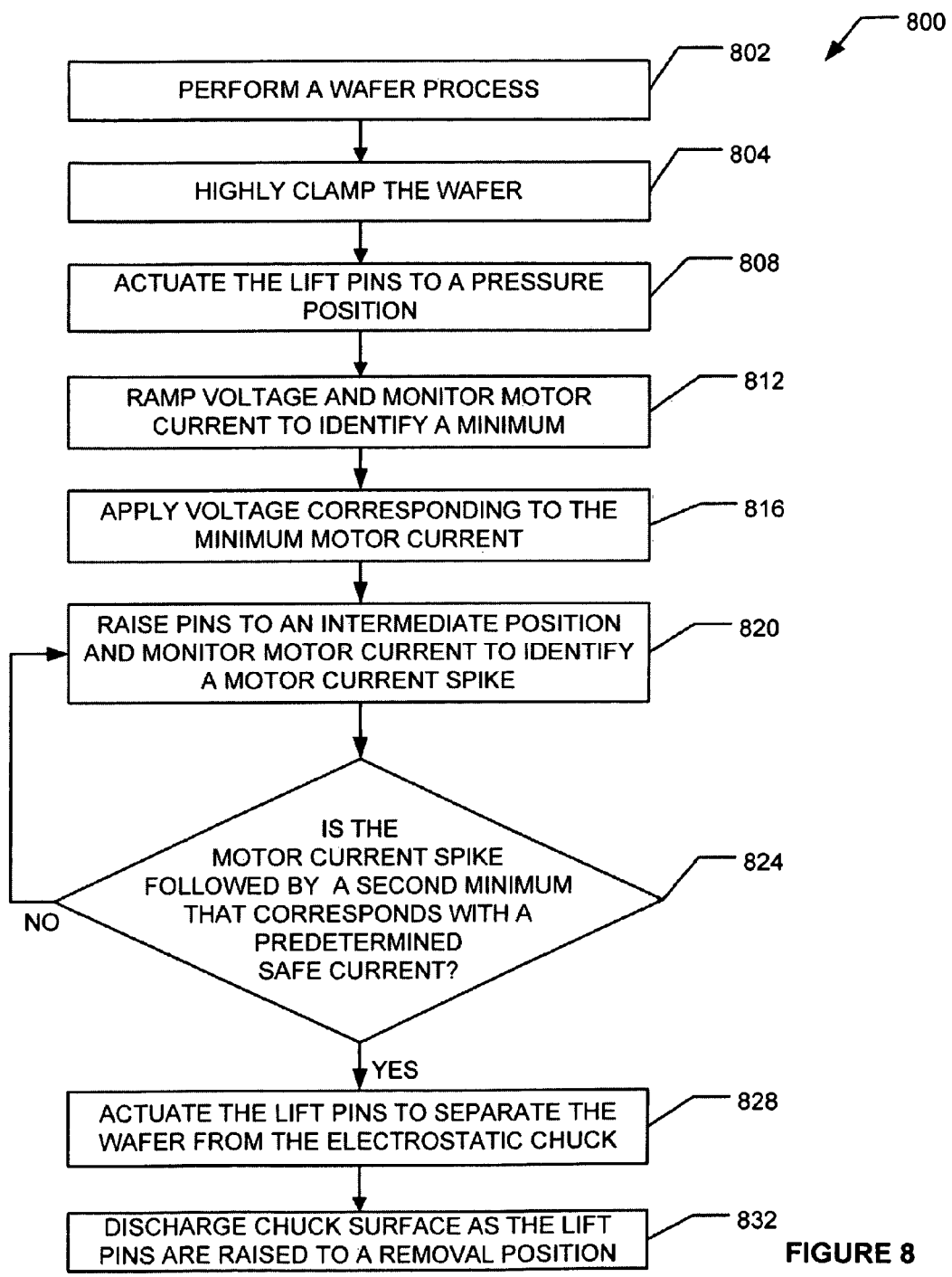
FIG. 8 is a flow diagram of a process for dechucking a wafer from an electrostatic chuck in accordance with one embodiment of the invention.

FIG. 8 illustrates a detailed process 800 for safe removal of a wafer from an electrostatic chuck. It will be appreciated that the process 800 described below is merely exemplary and may include fewer steps or a greater number of steps, and that the order of at least some of the steps may vary from that described below.

The process 800 begins by performing a wafer process (block 802), highly clamping the wafer (block 804), actuating the lift pins to the pressure position (block 808) and ramping the voltage and monitoring the motor current at the pressure position to identify a motor current minimum (block 812), as described above with reference to FIG. 5.

The process 800 continues by applying the voltage at the minimum and raising the pins to an intermediate position (block 816). For example, the intermediate position may be any value or range of values between about 0.5-1.6 mm. It will be appreciated that the pins may be raised less than 0.5 mm or more than 1.6 mm. The process 800 continues by monitoring the current as the pins are raised to identify a motor current spike (block 820) and determining whether the motor current spike is followed by a second minimum (block 824). If the motor current does not spike and return to a second minimum, the process 800 returns to block 812 and continues to cycle until the wafer is dechucked. If the motor current spikes and returns to a second minimum the process 800 continues by actuating the lift pins to separate the wafer from the electrostatic chuck (to the removal position) (block 828) and discharging the chuck surface as the pins are raised to the removal position (block 832).

It will be appreciated that when the motor current spikes, the motor current returns to a second minimum motor current value if the wafer is actually dechucked. If the wafer is not actually dechucked, the motor current spikes and stays at the higher value. It will be appreciated that if the motor current does not return to a second minimum after the spike that the process may be repeated from the beginning or the process may be stopped entirely so that the wafer can be manually dechucked.

Typically, the second minimum at the intermediate position is different than the minimum at the pressure position. The second minimum may also be verified by comparing the second minimum with the predetermined safe values at the intermediate position, as determined in the characterization process of FIG. 3 and illustrated by FIG. 3A. For example, if the lift pins are raised to 32 mils at the intermediate position, the minimum at the intermediate position can be compared with the motor current value at 32 mils for an unclamped wafer. If the second minimum falls within a certain percentage (i.e., empirical range) of the unclamped motor current value, then the lift pins are actuated to separate the wafer from the electrostatic chuck (to the removal position). Otherwise, the process may be repeated again or the chuck may be manually dechucked.

It will be appreciated that there may be situations in which the process 800 can continue to cycle indefinitely if the first minimum is not followed by a second minimum after the pins are raised to an intermediate position. In such embodiments, the controller 204 may provide an indication to a user that the wafer needs to be manually dechucked.

Figure 9:
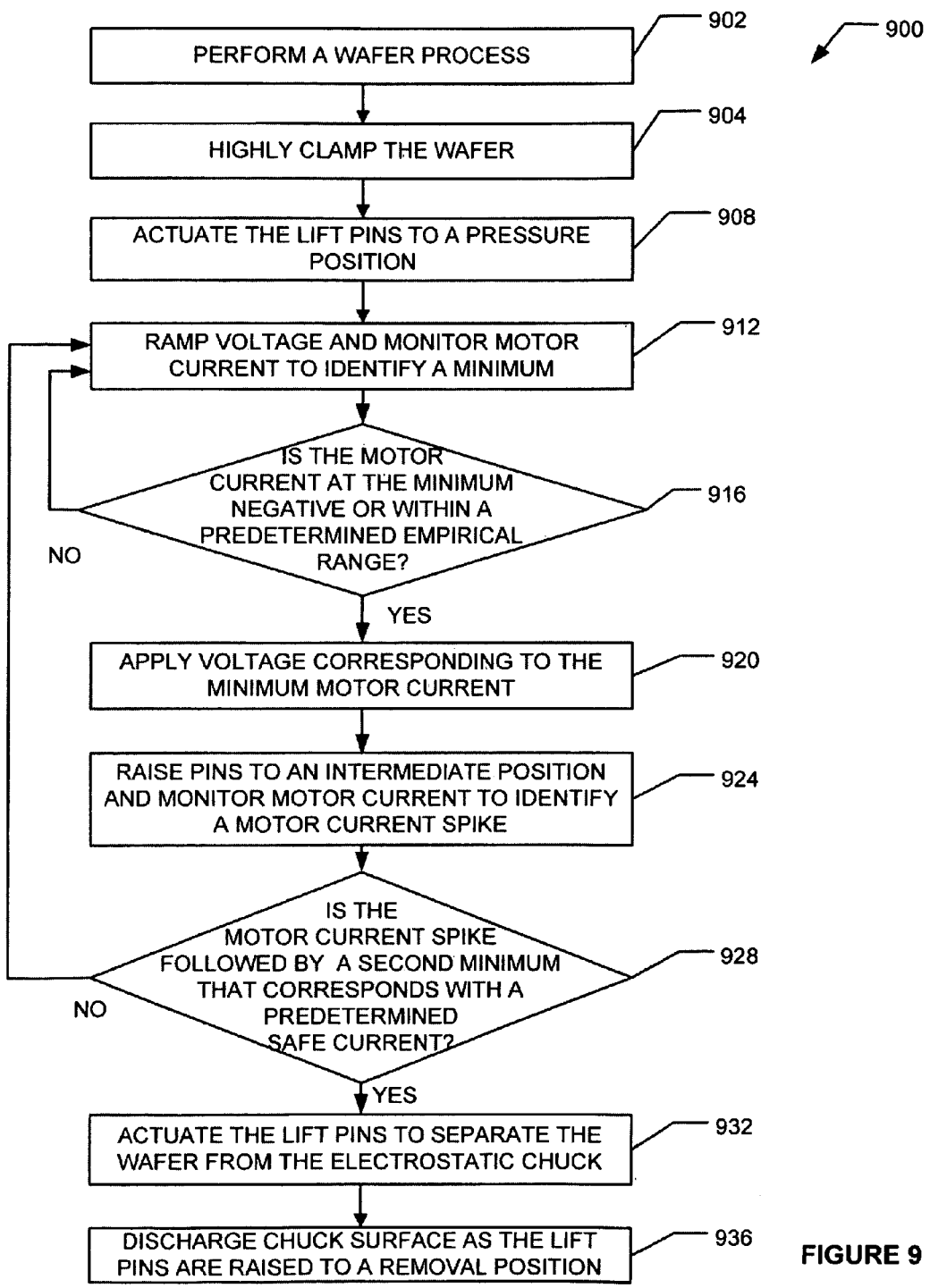
FIG. 9 is a flow diagram of a process for dechucking a wafer from an electrostatic chuck in accordance with one embodiment of the invention.

FIG. 9 illustrates a detailed process 900 for safe removal of a wafer from an electrostatic chuck. It will be appreciated that the process 900 described below is merely exemplary and may include fewer steps or a greater number of steps, and that the order of at least some of the steps may vary from that described below.

The process 900 begins by performing a wafer process (block 902), highly clamping the wafer (block 904), actuating the lift pins to the pressure position (block 908) and ramping the voltage and monitoring the motor current at the pressure position to identify a motor current minimum (block 912), as described above with reference to FIG. 5.

The process 900 continues by determining whether the motor current value at the minimum is negative or within a predetermined empirical range (block 916), as described above with reference to FIGS. 6 and 7, or both. If no, the process returns to block 912. If yes, the process 900 continues by applying the dechuck voltage at the motor current minimum (block 920), raising the lift pins to the intermediate position and monitoring the motor current at the minimum to identify a motor current spike (block 924), and determining whether the motor current spikes and returns to a second motor current minimum (block 928), as described above with reference to FIGS. 3A and 8. If no, the process 900 returns to block 912 and continues to cycle until the wafer is dechucked. If yes, the process 900 continues by actuating the lift pins to separate the wafer from the electrostatic chuck (to the removal position) (block 932) and discharging the chuck surface as the pins are raised to the removal position (block 936).

It will be appreciated that there may be situations in which the process 900 can continue to cycle indefinitely if the minimum does not fall within the empirical range or is negative, or is not followed by a second minimum after the pins are raised to an intermediate position. In such embodiments, the controller 204 may provide an indication to a user that the wafer needs to be manually dechucked.

It will be appreciated that in each of the embodiments described above with reference to FIGS. 4-9, the lift pins may be raised to a dechuck position before being raised to the removal position. At the dechuck position, an operator can visually inspect the wafer to make sure the wafer is dechucked or the force (e.g., current) can be monitored to make sure the wafer can be safely dechucked. If the wafer is not safely dechucked, the process for safely dechucking the wafer, as described above, may be repeated or the wafer may be manually be dechucked. In one example, the dechuck position may be about sixty-four thousandths. It will be appreciated, however, that the dechuck position may be lower than or higher than sixty-four thousandths.

It will also be appreciated that although the embodiments described above with reference to FIGS. 4-9 monitor the motor current to determine whether the wafer is safely dechucked, the force on the lift pins may be monitored in other ways. For example, force sensors, such as strain gages, piezoelectric transducers, and the like, may be used to determine whether the wafer is safely dechucked using the same methods described with reference to FIGS. 4-9.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A substrate processing system comprising:
   an electrostatic chuck;
   lift pins to move a wafer relative to the electrostatic chuck;
   a motor coupled with the lift pins and utilizing motor current to move the lift pins to move the wafer relative to the electrostatic chuck; and
   a voltage source coupled with the electrostatic chuck, the voltage source to apply a voltage to the electrostatic chuck; and
   a controller to measure the force on the lift pins, signal the voltage source to adjust the voltage applied to the electrostatic chuck, and signal the voltage source to fix the voltage applied to the electrostatic chuck at the point the measured force on the lift pins corresponds with a dechuck force value.

2. The substrate processing system of claim 1, wherein the controller is configured to measure the force on the lift pins by measuring the motor current.

3. The substrate processing system of claim 2, wherein the controller is configured to determine a motor torque from the measured motor current.

4. The substrate processing system of claim 1, wherein the controller is configured to adjust the voltage by applying a sweeping voltage.

5. The substrate processing system of claim 4, wherein the sweeping voltage is between about −5000V and +5000V.

6. The substrate processing system of claim 1, wherein the controller is configured to signal the motor to raise the lift pins to a pressure position, after processing of the wafer in a processing chamber is completed.

7. The substrate processing system of claim 1, wherein the electrostatic chuck is selected from the group consisting of a monopolor electrostatic chuck, a bipolar electrostatic chuck and a multipolar electrostatic chuck.

8. The substrate processing system of claim 1, wherein the controller is configured to measure the force on the lift pints using a force sensor.

9. A method for dechucking a wafer from an electrostatic chuck comprising:
   monitoring force on a lift-pin mechanism;
   determining a dechuck voltage based on the force; and
   dechucking the wafer at the dechuck voltage; and,
   wherein monitoring force comprises measuring motor current.

10. The method of claim 9, wherein monitoring the force on the lift-pin mechanism comprises monitoring the motor torque, and wherein determining the dechuck voltage based on the force comprises determining the dechuck voltage based on the motor torque.

11. The method of claim 9, wherein dechucking the wafer at the dechuck voltage comprises:
    applying a sweeping range of voltage applied to the electrostatic chuck; and
    fixing the voltage at the dechuck voltage when the motor torque is at a value corresponding to the dechuck voltage.

12. The method of claim 9, wherein dechucking the wafer at the dechuck voltage comprises actuating the lift-pin mechanism with the motor.

13. The method of claim 9, further comprising calibrating a controller coupled with the lift pin mechanism by monitoring force with an unclamped wafer.

14. The method of claim 9, further comprising calibrating a controller coupled with the lift pin mechanism by monitoring force with a slightly clamped wafer.

15. The method of claim 10, wherein monitoring the motor torque comprises identifying a minimum motor current.

16. The method of claim 15, wherein adjusting the voltage comprises applying the voltage corresponding to the minimum motor current.

17. The method of claim 15, wherein adjusting the voltage comprises applying the voltage corresponding to the minimum motor current if the minimum is within a predetermined empirical range.

18. The method of claim 15, wherein adjusting the voltage comprises applying the voltage corresponding to the minimum motor current if the motor current is negative.

19. The method of claim 15, wherein adjusting the voltage comprises applying the voltage corresponding to the minimum motor current, and wherein the method further comprises:
    actuating the lift pins to an intermediate position;
    monitoring the motor current to identify a spike followed by a second minimum motor current when the lifts pins are actuated; and
    actuating the lift pins to a removal position if the spike occurs and is followed by the second minimum.

20. The method of claim 19, further comprising determining whether the first minimum and second minimum fall within a predetermined empirical range.

21. The method of claim 19, further comprising determining whether the first minimum and second minimum are negative.

22. The method of claim 15, wherein the force on the lift-pin mechanism is monitored using a force sensor.

23. The method of claim 15, wherein dechucking the wafer comprises discharging the chuck surface.

24. A method for dechucking a wafer from an electrostatic chuck comprising:

monitoring a motor current of a motor coupled with lift pins;

adjusting a voltage applied to the electrostatic chuck to a dechuck value based on the motor current; and actuating the lift pins to a removal position to separate the wafer from the electrostatic chuck when the voltage is adjusted; and, further comprising raising the lift pins to a pressure position before monitoring the motor current.

25. The method of claim 24, further comprising sweeping the voltage applied to the electrostatic chuck through a voltage range.

26. The method of claim 25, wherein the voltage range is between about −5000V and +5000V.

27. The method of claim 24, further comprising characterizing the wafer to identify a pre-determined current value.

28. The method of claim 27, wherein the pre-determined value comprises a range of values.

29. The method of claim 27, wherein determining the pre-determined value comprises measuring the motor current with an unclamped wafer and measuring the motor current with a slightly clamped wafer.

30. The method of claim 24, wherein monitoring the motor current comprises identifying a minimum motor current.

31. The method of claim 30, wherein adjusting the voltage comprises applying the voltage corresponding to the minimum motor current.

32. The method of claim 30, wherein adjusting the voltage comprises applying the voltage corresponding to the minimum motor current if the minimum is within a predetermined empirical range.

33. The method of claim 30, wherein adjusting the voltage comprises applying the voltage corresponding to the minimum motor current if the motor current is negative.

34. The method of claim 30, wherein adjusting the voltage comprises applying the voltage corresponding to the minimum motor current, and wherein the method further comprises:

actuating the lift pins to an intermediate position;

monitoring the motor current to identify a current spike followed by a second minimum motor current; and actuating the lift pins to the removal position if the current spike occurs and is followed by a second minimum.

35. The method of claim 34, further comprising determining whether the first minimum and the second minimum fall within a predetermined empirical range.

36. The method of claim 34, further comprising determining whether the first minimum and the second minimum are negative.

37. The method of claim 24, further comprising discharging the chuck surface.

38. A method comprising:

measuring force on a lift-pin mechanism for an unclamped wafer;

storing the measured force for the unclamped wafer;

measuring force on a lift-pin mechanism for a wafer clamped at a low voltage; and storing the measured force for the wafer clamped at a low voltage.

39. The method of claim 38, wherein measuring force on a lift-pin mechanism comprises measuring a motor current.

40. The method of claim 38, wherein measuring force on a lift-pin mechanism comprises measuring a motor current at a plurality of lift pin positions.

41. The method of claim 38, wherein measuring force on a lift-pin mechanism comprises measuring a plurality of motor currents for the wafer clamped at a plurality of low voltages and storing each of the plurality of motor currents.

42. The method of claim 38, wherein measuring force on a lift-pin mechanism comprises measuring the force using a force sensor.

* * * * *